(12) United States Patent
Fedigan et al.

(10) Patent No.: US 8,787,594 B1
(45) Date of Patent: Jul. 22, 2014

(54) MULTI-STREAM AUDIO LEVEL CONTROLLER

(75) Inventors: Stephen J. Fedigan, Plano, TX (US);
Daniel S. Jochalson, Dallas, TX (US);
Jason D. Kridner, Houston, TX (US);
Jeffrey S. Hayes, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1237 days.

(21) Appl. No.: 11/342,513

(22) Filed: Jan. 30, 2006

Related U.S. Application Data (60) Provisional application No. 60/648,368, filed on Jan. 28, 2005.

(51) Int. Cl.
*H03G 3/00* (2006.01)
*H04B 1/00* (2006.01)

(52) U.S. Cl.
USPC .......................................... 381/104; 381/119

(58) Field of Classification Search
USPC ............ 700/94; 381/104, 107, 108, 109, 119; 369/3, 4
See application file for complete search history.

(56) References Cited

U.S. PATENT DOCUMENTS 5,703,794 A * 12/1997 Heddle et al. .................... 700/94
7,450,728 B2 * 11/2008 Aiso et al. ..................... 381/119

* cited by examiner

*Primary Examiner* — Duc Nguyen
*Assistant Examiner* — Kile Blair
(74) *Attorney, Agent, or Firm* — Mirna Abyad; Frederick J. Telecky, Jr.

(57) ABSTRACT

A volume level and crossfade controller with programmable fades and audio stream priority controls saturation for a multiple audio stream mixer. Start of fade and end of fade events trigger updates of relative volume level targets and volume ramps.

6 Claims, 9 Drawing Sheets

MULTI-STREAM AUDIO LEVEL CONTROLLER

CROSS-REFERENCE TO RELATED APPLICATIONS

This application claims priority from provisional application No. 60/648,368, filed Jan. 28, 2005. The following co-assigned co-filed patent application discloses related subject matter application Ser. No. 11/342,514, filed Jan. 30, 2006.

BACKGROUND OF THE INVENTION

The present invention relates to digital signal processing, and more particularly to digital audio stream playback methods and devices.

In audio applications, it is common to mix several sources to form a final output. For example, in an audio production environment or on a personal audio player, beginning new and ending old streams are combined during a crossfade operation for a smooth transition in which the ending stream is faded out while the beginning stream is faded in. These streams may be further combined with a user interface (UI) sound generated in response to keypresses or other external events. Directly summing these streams together might cause saturation depending on the stream levels. An alternative would be to "gain down" each stream prior to mixing them. For example, when combining four streams, avoid saturation by attenuating each stream by −12 dB prior to mixing.

While this certainly would work, in many cases the approach would be too conservative and leave too much head room. Adjusting these weights depending on the status of each stream is a superior solution. For example, if a stream of music were playing, it could be gained down during a user interface (UI) sound to make room for this new stream. When the UI sound finished playing, the music stream would be gained back up to take advantage of the available signal range. This approach is practiced manually in production environments by audio engineers operating studio mixing boards. One track of music might be faded down to make room for another track, and then faded up when the second track is finished.

U.S. Pat. No. 4,947,440 discloses a modification of the theoretical crossfade curves for two sources (one fades out while the second fades in) to avoid the perceptual cut at a fade end.

U.S. Pat. No. 5,581,480 discloses non-linear (soft) clipping for mixing of multiple sources to avoid saturation.

SUMMARY OF THE INVENTION

The present invention provides multiple audio stream volume levels using relationships among the streams to control gain functions.

DESCRIPTION OF THE PREFERRED EMBODIMENTS

1. Overview

Figure 13:
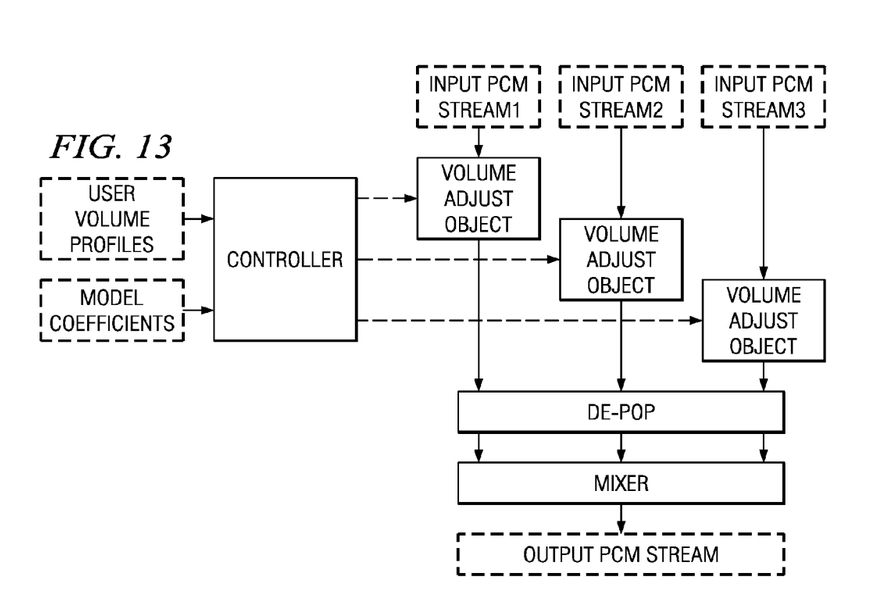
FIG. 13 illustrates module components.

FIG. 13 illustrates a preferred embodiment structure for crossfades of three audio streams with selectable fade profiles and automatic control to avoid saturation and perceptual cuts but with effective use of available dynamic range. The selectable fade profiles may be multi-segment logarithmic for simple parameterization plus general shape emulation and the number of audio streams could be varied.

Figure 1:
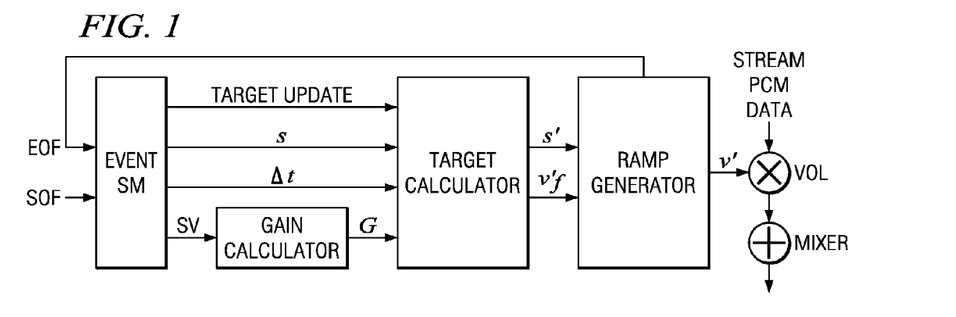
FIGS. 1-2 illustrate preferred embodiment systems.

FIG. 1 (vector notation) shows a preferred embodiment of the volume level controller with various functional blocks: an Event State Machine, a Gain Calculator, a Target Calculator, and a Ramp Generator. An Event State Machine keeps track of the current state (active or inactive) of each audio stream based on trigger events such as SOF (Start of Fade) and EOF (End of Fade); SV is the state vector. The Target Calculator determines slopes and target volumes for the Ramp Generator based on slope and timing information provided by the Event State Machine. Finally, the Ramp Generator adjusts the volumes of each of the audio streams prior to final mixing through the multiplier. That is, the multiplier of FIG. 1 multiplies each input stream by a corresponding volume level and feeds these products to the mixer. The components of FIG. 1 are described in the following sections.

Preferred embodiment applications include audio stream crossfading generally such as FM radio input mixed with hard-disk playback content, user interface (e.g., MIDI, WAV) generated sounds mixed with playback content, microphone input (e.g., disc jockey) mixed with hard-disk playback content, et cetera.

The preferred embodiment system's functional blocks may be implemented as hardware components, a mixture of hardware and software on programmable hardware, or as a software module on programmable hardware. The hardware could be digital signal processors (DSPs), general purpose programmable processors, application specific circuitry or systems on a chip (SoC) such as combinations of DSPs and RISC processors on the same chip with the RISC processor controlling them. A FIG. 13 software module could reside on a C55xx DSP from Texas Instruments with DSP/BIOS operating system and APIs. Stored programs could be in an onboard or external ROM, flash EEPROM, FeRAM, and so forth. System analog-to-digital converters and digital-to-analog converters could provide coupling to the real world such as microphones and loudspeakers, and modulators and demodulators (plus antennas for air interfaces) provide wireless/wireline coupling to networks for transmission. Encoded (e.g., mp3) audio can be packetized and transmitted over networks such as the Internet and played back on preferred embodiment systems.

2. Event State Machine

The Event State Machine keeps track of the current state (active or inactive) of each stream based on trigger events such as SOF (Start of Fade) and EOF (End of Fade). It also contains a fade profile (slopes and duration times) for each stream.

When the first SOF occurs, the Event State Machine sets the corresponding bit in the SV (State Vector) to 1, sets its slope to a positive pre-determined value, and requests an update from the Target Calculator. The change in state vector SV forces a change in G, the gain adjustment vector. The Target Calculator responds by computing new volume targets and slopes for the Ramp Generator based on the slope change which has occurred. The adjusted volume profiles produced by the Ramp Generator are applied to the active audio streams to fully utilize the dynamic range without causing saturation prior to mixing.

When the fade-in is completed, the Event State Machine is notified by EOF (End of Fade) signal coming from the Ramp Generator. Like the SOF, the Event SM responds to these events by changing the state bit and slope of the corresponding stream, and by requesting a Target Update from the Target Calculator. As before, this block modifies appropriately the slopes and volume targets being fed into the Ramp Generator.

Figure 3:
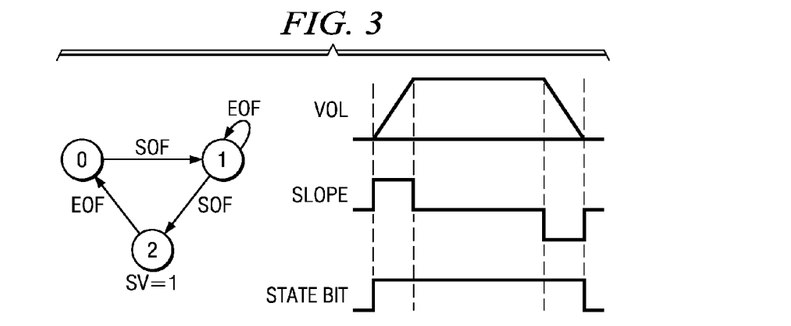
FIG. 3 shows a state machine.

FIG. 3 illustrates a state machine (SM) which would be in the Event State Machine (ESM) for a single audio stream. The SM shown is for a single state-bit; the entire ESM (as in FIG. 1) includes N of these FIG. 3 SMs, one available for each stream. When a stream is in the inactive state, an SOF (Start of Fade) event causes a state transition from 0 to 1; the state becomes active; the state bit goes to 1; and the slope assumes a positive value. At the end of the fade-up (fade in), the EOF flag is asserted, and the slope returns to 0. When the fade-down (fade out) begins, the SOF flag is asserted; the state transitions from 1 to 2; and the output slope goes negative. When the EOF signal is asserted at the completion of the fade-down, the state goes back to 0, the state bit goes back to 0, and the slope returns to 0, thus completing the cycle.

3. Gain Lookup Table

Figure 2:
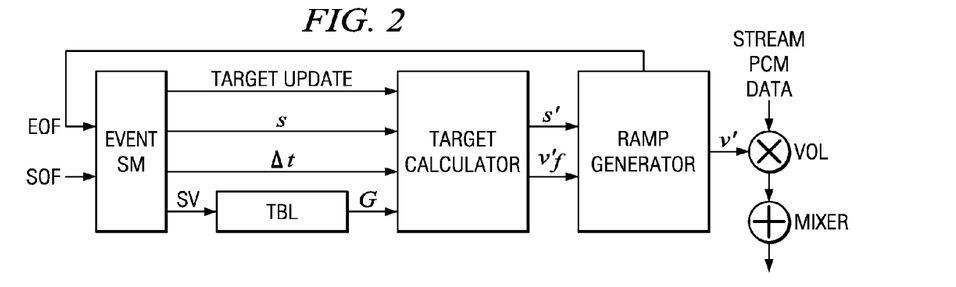

The rules for adjusting the gain of each stream (gain adjustment vector) in a first preferred embodiment are embodied in gain table TBL; see FIG. 2 where TBL has replaced Gain Calc. As a first example, consider a three input stream system with the following lookup table for the gains, G1, G2, and G3, for the three streams:

| state vector | G1 | G2 | G3 |
|---|---|---|---|
| 000 | 0 | 0 | 0 |
| 001 | 0 | 0 | 1 |
| 010 | 0 | 1 | 0 |
| 011 | 0 | ½ | ½ |
| 100 | 1 | 0 | 0 |
| 101 | ½ | 0 | ½ |
| 110 | ½ | ½ | 0 |
| 111 | ⅓ | ⅓ | ⅓ |

The state vector indicates the state of all streams in the system. Each state-bit indicates the state of its corresponding stream. In this example, the first bit indicates the state of stream 1, the second bit the state of stream 2, and the third bit stream 3. A value of '0' for this bit indicates that the corresponding stream is inactive, whereas a value of '1' indicates that the stream is active.

Figure 4:
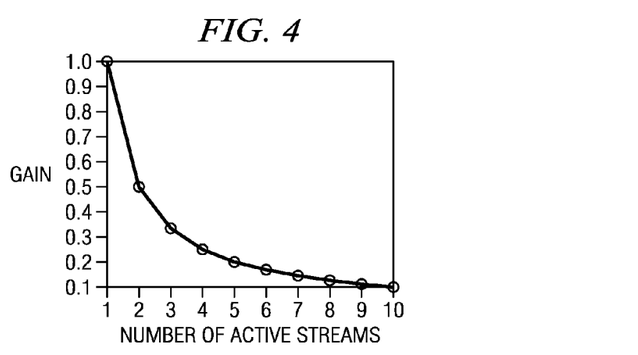
FIG. 4 is a graph of gain versus number of active streams.

In this first example, all of the streams are assigned equal priorities, in the sense that the gain applied to all streams is equal to 1 divided by the number of active streams. This means that as the number of streams increases the gain decreases monotonically to accommodate the new streams, and as the number decreases, the gain goes up to utilize the full signal range; see FIG. 4.

Figure 5:
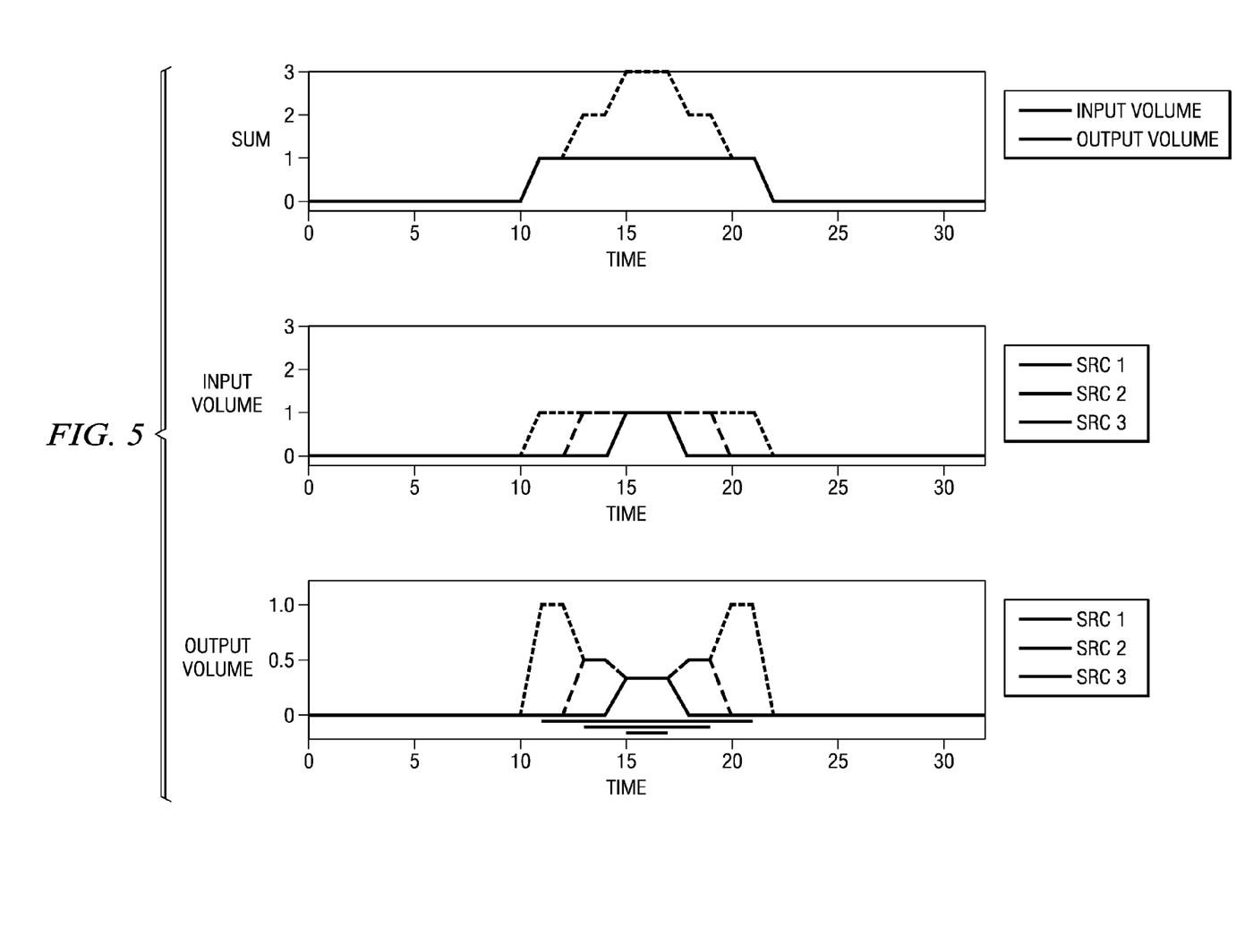
FIGS. 5-7 are examples.

FIG. 5 shows the volume profiles of three streams, which fade in sequentially and fade out in reverse sequence. Notice that the gain decreases as the number of active streams increases. The middle panel of FIG. 5 shows the nesting of the individual stream volume profiles; the top panel shows the sum of these three profiles; and the bottom panel shows the affect of application of the gain from the foregoing gain table. In particular, when the first stream fades in its volume is at 1.0; next, when the second stream fades in the volume for each stream drops to 0.5, and then when the third stream fades in the volume for each stream drops to 0.33. The fade outs lead to the same volumes in the reverse order.

For a second example with priorities among three streams, consider the following gain lookup table:

| state vector | G1 | G2 | G3 |
|---|---|---|---|
| 000 | 0 | 0 | 0 |
| 001 | 0 | 0 | ½ |
| 010 | 0 | 1 | 0 |
| 011 | 0 | ½ | ½ |
| 100 | 1 | 0 | 0 |
| 101 | ½ | 0 | ½ |
| 110 | ½ | ½ | 0 |
| 111 | ¼ | ¼ | ½ |

In this second example Stream 3 is assigned the highest priority and Streams 1 and 2 are assigned the same priority level, which is lower than that of Stream 3. This means that Streams 1 and 2 affect each other's volume equally. Additionally, while Stream 3 lowers the gains of Streams 1+2, Streams 1+2 do not alter Stream 3's volume.

4. Target Calculator

Figure 6:
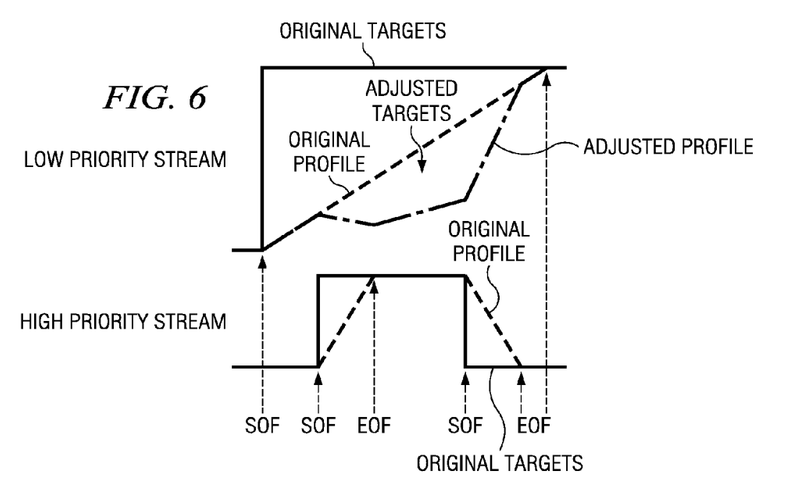

The Target Calculator block re-computes target volumes when new streams fade-in and old streams fade-out. It is triggered by Start-of-Fade (SOF) and End-of-Fade (EOF) events. In many cases, the original targets are adjusted by the gain-table to avoid saturation. FIG. 6 shows the original and adjusted targets when a higher priority stream enters and exits while a lower priority stream is fading in. To accomplish this, the target calculator maintains a set of global state variables and state variables for each stream. These variables are defined as:

$\Delta t(n)$=time between current event and stream n's End of Fade $\Delta t_{min}$=time between current event and next event (global)

$\Delta t_{eof}$=time until next EOF event (global)

$\Delta t_{fade}$=fade time $v_i(n)$=volume for stream n at the current event time (initial)

$v'_i(n)$=adjusted volume for stream n at the current event time $v_f(n)$=target volume for stream n (final)

Figure 7:
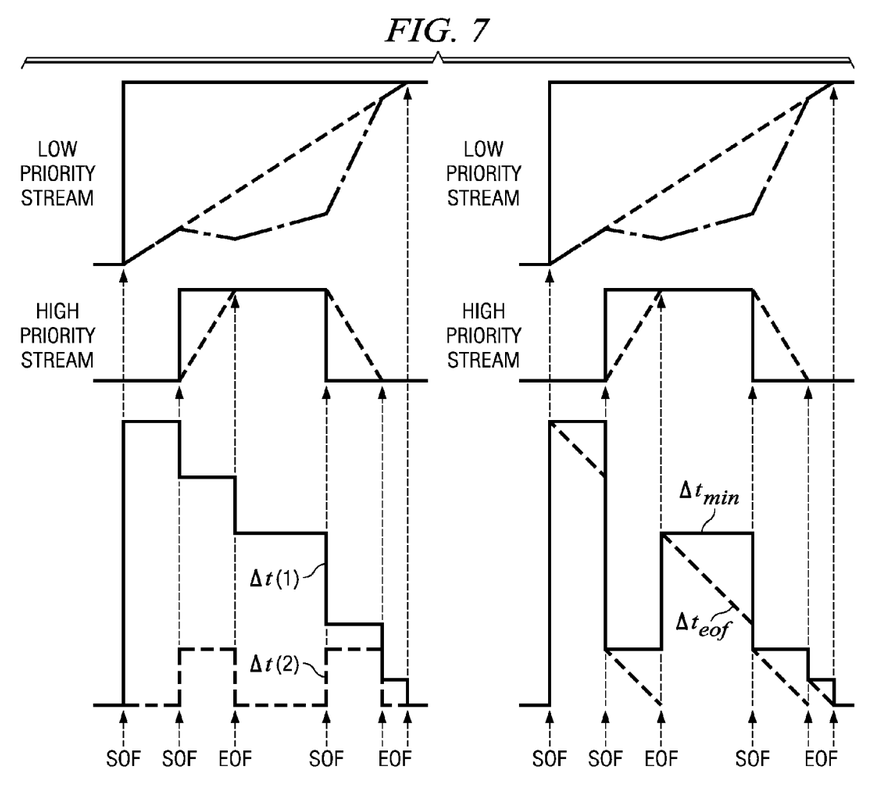

$v'_f(n)$=adjusted target volume for stream n $s(n)$=slope required to reach target for stream n $s'(n)$=adjusted slope required to reach adjusted target for stream n $s_{fade}$=slope for fade $g(n)$=gain adjustment for stream n's target volume Note that the stream state variables can be grouped together to form vectors. To clarify these definitions, the graphs in the lower portion of FIG. 7 show how the time variables evolve for the example of FIG. 6, which is reproduced in the upper portion of FIG. 7. Note that the three variables $\Delta t(1)$, $\Delta t(2)$, and $\Delta t_{min}$ are updated only when an SOF or EOF event occurs while $\Delta t_{eof}$ is continuously updated and thus has negative slope. The gain adjustment comes from a gain table with four states (two streams) and the second stream affects the gain of the first stream.

In particular, the target calculator operates under the three possible conditions as follows.

(1) When an SOF occurs, the following events take place if no other streams are currently fading in:

(a) To begin, set the initial volume vector equal to the current final volume vector:

$$v_i(n)=v_f(n) \text{ all } n$$

$$v'_i(n)=v'_f(n) \text{ all } n$$

(b) For stream(s) starting to fade according to the SOF, the new fade times and slopes are entered into the vector:

$$\Delta t(j)=\Delta t_{fade} \text{ for stream(s) } j \text{ of the SOF}$$

$$s(j)=s_{fade}$$

(c) For other streams, simply update the Δt to account for the current event $$\Delta t(n)=\Delta t(n)-\Delta t_{fade} \text{ for } n \neq j$$

(d) From the foregoing, determine the next event time over the set of active streams:

$$\Delta t_{min} = \min_{\Delta t(n)>0} \Delta t(n)$$

(e) Compute the target volumes at the next EOF time:

$$v_f(n)=v_i(n)+s(n)\Delta t_{min} \text{ all } n$$

(f) Adjust the target volume based on the stream states (gain table):

$$v'_f(n)=g(n)v_f(n) \text{ all } n$$

(g) Using the new adjusted target volume, compute adjusted slopes:

if $\Delta t_{min}>0$, then $s'(n)=[v'_f(n)-v'_i(n)]/\Delta t_{min}$ all $n$ if $\Delta t_{min}=0$, then $s'(n)=0$ all $n$ (h) Finally, before exiting, set the EOF counter equal to the next event time:

$$\Delta t_{eof}=\Delta t_{min}$$

(2) When an EOF occurs, a similar sequence of events take place with the main difference being that the fade time and slope are set to zero for those streams ending their fade:

(a) To begin, set the initial volume vector equal to the current final volume vector:

$$v_i(n)=v_f(n) \text{ all } n$$

$$v'_i(n)=v'_f(n) \text{ all } n$$

(b) For stream(s) ending the fade according to the EOF, the fade time and slope are set to 0:

$$\Delta t(j)=0 \text{ for stream(s) } j \text{ of the EOF}$$

$$s(j)=0$$

(c) For streams not ending their fade, simply update the Δt to account for the current event:

$$\Delta t(n)=\Delta t(n)-\Delta t_{fade} \text{ for } n \neq j$$

(d) From the foregoing, determine the next event time over the set of active streams:

$$\Delta t_{min} = \min_{\Delta t(n)>0} \Delta t(n)$$

(e) Compute the target volumes at the next EOF time:

$$v_f(n)=v_i(n)+s(n)\Delta t_{min} \text{ all } n$$

(f) Adjust the target volume based on the stream states:

$$v'_f(n)=g(n)v_f(n) \text{ all } n$$

(g) Using the new adjusted target volume, compute adjusted slopes:

if $\Delta t_{min}>0$, then $s'(n)=[v'_f(n)-v'_i(n)]/\Delta t_{min}$ all $n$ if $\Delta t_{min}=0$, then $s'(n)=0$ all $n$ (h) Finally, before exiting, set the EOF counter equal to the next event time:

$$\Delta t_{eof}=\Delta t_{min}$$

(3) When an SOF occurs while other streams are currently fading, the sequence of events becomes slightly more complicated because the system must essentially determine "where it is" in the existing fades:

(a) To begin, retrieve the current volume levels:

$$v_i(n)=v_f(n)-s(n)\Delta t_{eof} \text{ all } n$$

$$v'_i(n)=v'_f(n)-s'(n)\Delta t_{eof} \text{ all } n$$

(b) For stream(s) starting to fade according to the SOF, the new fade times and slopes are entered into the vector:

$$\Delta t(j)=\Delta t_{fade} \text{ for stream(s) } j \text{ of the SOF}$$

$$s(j)=s_{fade}$$

(c) For streams not ending their fades, simply update the Δt to account for the current event $$\Delta t(n)=\Delta t(n)-\Delta t_{fade} \text{ for } n \neq j$$

(d) From the foregoing, determine the next event time over the set of active streams:

$$\Delta t_{min} = \min_{\Delta t(n)>0} \Delta t(n)$$

(e) Compute the target volumes at the next EOF time:

$$v_f(n)=v_i(n)+s(n)\Delta t_{min} \text{ all } n$$

(f) Adjust the target volume based on the stream states:

$$v'_f(n)=g(n)v_f(n) \text{ all } n$$

(g) Using the new adjusted target volume, compute adjusted slopes:
if $\Delta t_{min}>0$, then $s'(n)=[v'_f(n)-v'_i(n)]/\Delta t_{min}$ all $n$ if $\Delta t_{min}=0$, then $s'(n)=0$ all $n$ (h) Finally, before exiting, set the EOF counter equal to the next event time:

$$\Delta t_{eof}=\Delta t_{min}$$

5. Ramp Generator

Figure 8:
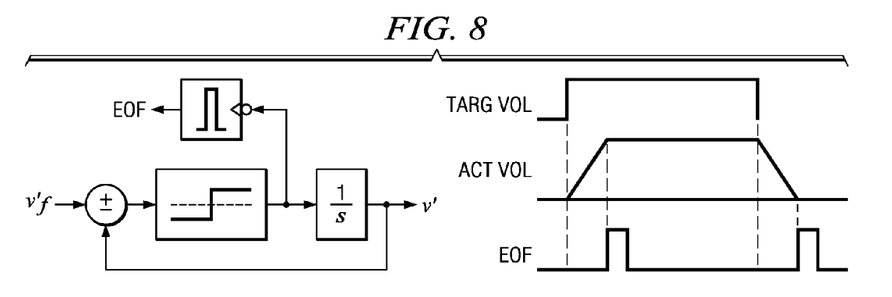
FIG. 8 shows a ramp generator.

The ramp generator block in FIGS. 1-2 is a bank of n ramp generators, one for each stream. Each of the ramp generators takes in a target volume and slope and ramps the actual volume until it reaches the target, at which time the edge detector fires the EOF signal. That is, two ramp generators produce the low priority stream adjusted profile and the high priority stream profile in FIGS. 6-7 by piecewise linear ramps. The actual volume levels are sent to the bank of multipliers, which adjust the volume of the individual streams prior to the mixing. FIG. 8 illustrates the individual ramp generator operation.

6. Gain Function Preferred Embodiments

Figure 11:
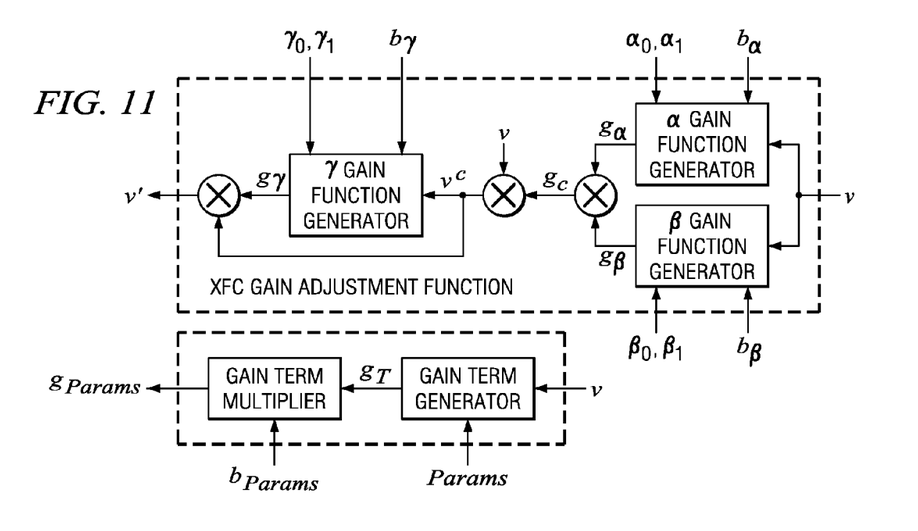
FIG. 11 is a block diagram of a preferred embodiment gain calculator.

The volume adjustment function (gain function g(n) in the foregoing) modifies the volume levels of audio streams prior to mixing with a common application being to prevent saturation. In general, when new streams are added, existing streams are "gained down" to make room for the new streams, and when a stream leaves, the remaining streams are "gained up" again to fill up the available headroom. The preferred embodiment of FIG. 9 adjusts volumes by evaluating and applying a set of parameterized gain functions, rather than a gain table; note the input of $V_f$ target volumes to the Gain Fxns block to be used in gain function computations. FIG. 11 illustrates a preferred embodiment gain function block. These gain functions define the rules by which gains are adjusted and indirectly define the relative importance of each stream. If a stream has the highest priority, its volume is not modified by the presence of other streams, and therefore its gain function does not depend on the volume levels of the other streams. However, if a stream has low priority, it will be a strong function of the other streams' volume levels.

Figure 9:
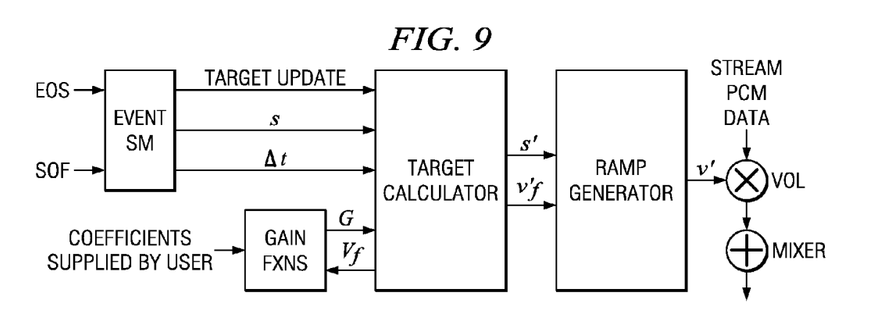
FIG. 9 illustrates a preferred embodiment system.

In FIG. 9 the target calculator and ramp generator may be the same as for the first preferred embodiments. While evaluating continuous functions requires more computations, the approach permits multi-segment fades, which can approximate complex fade functions. The gain function parameters, which are supplied by the application, can implement a variety of different priority structures and will be discussed in detail below.

Figure 10:
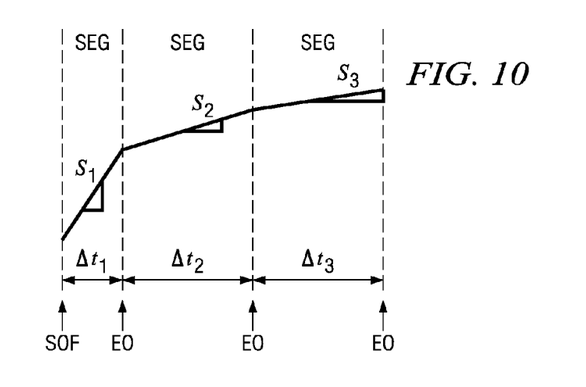
FIG. 10 shows a volume profile.

When a new fade begins, a volume profile is entered into the ESM for a given stream; FIG. 10 is an example volume profile with three segments. This profile is specified by an array of segments. Each segment contains a slope and a time. At the beginning of each segment in the profile, the ESM presents the Target Calculator with the slope and duration of the new segment and toggles the update flag. When the fade ends, the ESM supplies the Target Calculator with a slope and duration of 0.

The upper portion of FIG. 11 shows the structure and input parameters for the gain function block, and the lower portion shows internal details of the three gain function generators. The input volume vector is sent into the alpha ($\alpha$) and beta ($\beta$) function generators, which compute gain vectors $g_\alpha$ and $g_\beta$, respectively. These two vectors are combined by pointwise (vector-component-wise) multiplication and applied to the input volume vector v. The modified volume vector $v^c$ serves as the input to a gamma ($\gamma$) function generator, which produces a $\gamma$ gain vector, $g_\gamma$, which is applied to the modified volume vector to obtain the final result. That is, first compute the modified volume vector: $v^c = g_\alpha(v, \alpha, b_\alpha) g_\beta(v, \beta, b_\beta) v$. Then compute the adjusted volume: $v' = g_\gamma(v^c, \gamma, b_\gamma) v^c$. Each multiplication is pointwise.

The $\alpha$ gain terms (lower portion of FIG. 11) are generated by the equation $$T_\alpha = \alpha_1 v + \alpha_0$$

where $\alpha_0$ is an offset vector and $\alpha_1$ is a gain matrix. Each element of the gain vector is the product of selected gain terms. A bit matrix $b_\alpha$ describes which gain terms are multiplied together for each gain vector element.

The $\gamma$ gain terms are generated in a manner analogous to the $\alpha$ gain terms. The $\beta$ gain terms are generated by the equation:

$$T_\beta = 1/(\beta_1 v + \beta_0)$$

where $\beta_0$ is an offset vector and $\beta_1$ is a gain matrix and the reciprocal operator represents a pointwise vector reciprocal operation. A bit matrix $b_\beta$ describes which gain terms are multiplied together for each gain vector element. That is, the bit matrix generates products of linear combinations of volume vector components and reciprocals of linear combinations.

The foregoing class of functions may be used to realize many different priority structures. Essentially, the $\alpha$ generator adjusts the volume of unequal-priority streams, the $\beta$ generator adjusts the volume of streams with equal priority, and the $\gamma$ generator comes into play when two or more streams of equal priority have lower priority streams beneath them and is used to apply factors which contain the total adjusted volume of the equal priority streams.

As a first example, the gain function vector $$g = \begin{bmatrix} 1 \\ 1 - v_1 \\ (1 - v_1)(1 - v_2) \end{bmatrix}$$

gives Stream 1 the highest priority, Stream 2 intermediate priority, and Stream 3 the lowest priority. This gain function vector comes from $$T_\alpha = \begin{bmatrix} 1 \\ 1 - v_1 \\ 1 - v_2 \end{bmatrix}$$

with the bit matrix $$b_\alpha = \begin{bmatrix} 1 & 0 & 0 \\ 0 & 1 & 1 \\ 0 & 0 & 1 \end{bmatrix};$$

the third column generates the product in the third component of g.

A second example gain function vector:

$$g = \begin{bmatrix} \dfrac{1}{1 + v_2 + v_3} \\ \dfrac{1}{1 + v_1 + v_3} \\ \dfrac{1}{1 + v_1 + v_2} \end{bmatrix}$$

gives all three streams equal priority when their target volumes are equal.

As a final example, the gain function vector $$g = \begin{bmatrix} \dfrac{1}{1 + v_2} \\ \dfrac{1}{1 + v_1} \\ 1 - \dfrac{v_1}{1 + v_2} - \dfrac{v_2}{1 + v_1} \end{bmatrix}$$

gives the first two streams equal priority and the third stream a lower priority. Generally speaking, the $\alpha$ and $\gamma$ terms are intended for attenuating streams that have lower priority levels based on the volumes of higher priority streams. The $\beta$ terms have been intended for equal reduction of volume levels for streams of equal priority.

7. Example

Figure 12:
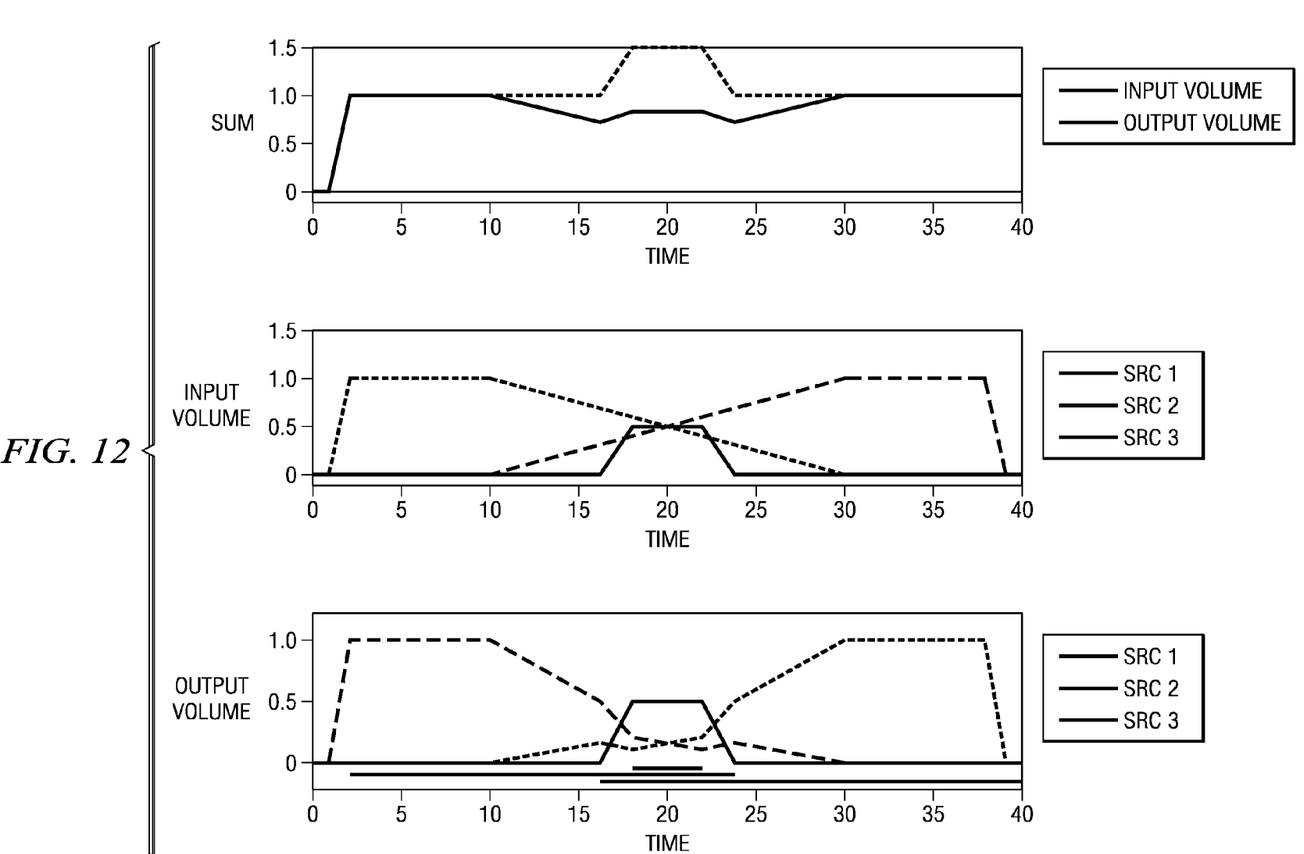
FIG. 12 is an example.

In the example of FIG. 12, audio Streams 2 and 3 have equal priority, and Stream 1, which represents a user interface (UI) sound, has higher priority than Streams 2 and 3. At time 10, Streams 2 and 3 begin a 20-second crossfade (Stream 2 fades out and Stream 3 fades in completely by time 30). The middle panel of FIG. 12 illustrates the unadjusted profile of each of streams 2 and 3 plus the UI sound (which has a maximum level of 50%); the bottom panel shows adjusted profiles; and the top panel shows the sum of the input profiles and the sum of the output profiles. At time 16, Stream 1 starts a fade-in to a 50% level (reached at time 18), which pushes down the levels of Streams 2 and 3 to avoid saturation. At time 18 (the EOF of stream 1), the target level of Stream 3 is adjusted from 1 to 0.5, thus decreasing its slope. When Stream 1 begins its fade-down at time 22, the slopes of Streams 2 and 3 are re-adjusted so that they return to their original trajectories by the time the fade-down of Stream 1 is completed. This functionality can be realized by either preferred embodiment (gain table or parameterized gain functions) because the fades are single segment.

8. Preferred Embodiment Software Modules

FIG. 13 illustrates a preferred embodiment software module architecture which extends the functionality of FIG. 1 and provides one interface to control both the overall mixing and the volume alterations of individual streams. The module includes a crossfade level controller (XFC), volume adjust objects (one for each monaural stream, two for each stereo stream), de-pop, and mixer. The user volume profiles and the model coefficients set up the XFC object for control of the volumes of the incoming streams in response to events, including the computations as in sections 4-6. Multi-segment user volume profiles can emulate most fade shapes; and model coefficients specify how different streams are to interact, including simple priority-based systems. The de-pop will smooth out a sudden stream stop transition, otherwise it simply passes the outputs to the mixer, which sums the samples to the output buffer. The following sections have more details.

9. User Volume Profiles

Figure 14:
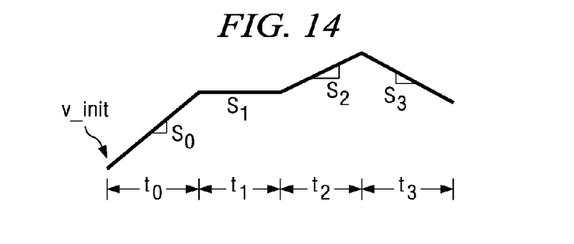
FIG. 14 shows a volume profile.

User volume profiles are constructs consisting of seven parts:
(1) stream_id=unique identification for each stream.
(2) num_events=number of time segments in a user volume profile; as an example, see FIG. 14 illustrating a volume profile (volume as a function of time) with four segments. Multiple segments provide user flexibility.
(3) del_t=an array that holds the lengths of all segments; e.g., {t0, t1, t2, t3} in FIG. 14.
(4) s=an array that holds the slopes of all segments; e.g., {s0, s1, s2, s3} in FIG. 14.
(5) v_init=the initial value (volume) for start of the volume profile.
(6) status=the current state for the stream; see FIG. 15 and the following description.
(7) end_of_profile_status=designates the status when the end of the user volume profile is reached. Three different values specify these behaviors:
    0=delete the stream upon completion (common for final fade-out on a stream).
    1=the stream is resident and silent upon completion (common for final fade-out on a stream).
    2=the stream is active and playing upon completion (common for fade-in on a stream).

10. Stream States

The XFC module contains six possible states for each stream. The following list contains the enumeration value for each state, plus a description of the state.
STREAM_OFF (0)—The stream is turned off and is not mixed into the final output. An XFC stream is only in this state at the end of a final fade, or after depop is completed following a sudden stop. This is a transitory state, since a stream is either immediately deleted or set to STREAM_DELAY_FADE.
STREAM_ON (1)—The stream is turned on and is mixed into the final output. This state occurs either during a fade, or when a stream is playing at a constant volume. When a new fade begins, the XFC immediately changes the state from STREAM_NEW_FADE to STREAM_ON.
STREAM_NEW_FADE (2)—This state, set by the user, signifies to start the current volume profile (fade) at the next XFC_apply( ) call. The XFC detects this new stream state and immediately sets the state to STREAM_ON at the next XFC_apply( ) call.
STREAM_DELAY_FADE (3)—This state signifies that a stream is still resident, but is not actively mixed into the final output. Alternative descriptions of this state could be "stream suspended" or "stream inactive". The XFC keeps all relevant data for the stream in its structures, but the stream is not played and does not affect other streams.
STREAM_DEPOP (−2)—When a sudden stop occurs, the XFC puts the stream in this state until it has completed its depop processing. Once the XFC has completed depop processing, the stream state is set to STREAM_OFF. The stream is not likely in this state for a very long period of time.
STREAM_STOP (−1)—This state, set by the user, signifies to stop the particular stream immediately. The XFC then performs depop processing, which puts the stream into STREAM_DEPOP state, until it is ready to be turned off.
In order to check the state for a particular stream, the user can look at the stream_states array in the XFC object. This can be achieved by calling the XFC_getStatus ( ) function, and then looking at the stream_states and stream_id_list arrays in the status structure. The following code displays an example of obtaining the stream status for Stream ID #1.

```
XFC_getStatus(xfc, &xfcStatus);
stream_id=1; // stream ID for the stream we are
// interested in
for (j=0; j<number_of_streams; j++) {
  if (xfcStatus.stream_id_list[j]==stream_id)
    index=j;
}
state=xfcStatus.stream_states[index];
```

As the code shows, the location of the stream ID in the stream_id_list corresponds to its location in the stream_states array. Consequently, stream_id_list and stream_states should always be the exact same length. By using these two arrays, the user can query the state for a particular stream.

Through user volume profiles the system can set the state of the crossfade level controller (XFC) for each individual stream; these states determine whether streams are active or not, how to mix active streams into the final output, and help signify the starts of new fades. When the XFC object is created, all streams are set to the STREAM_DELAY_FADE (inactive stream) state. If the user sets the state to STREAM_NEW_FADE using the XFC_fade( )function, the XFC module automatically changes the state to STREA- M_ON as it begins the fade. If the user wishes a stream to start immediately without a fade-in, he may set the stream's state to STREAM_ON to achieve this behavior. STREAM_ON signifies to mix this active stream into the final output. At completion of a volume profile, the XFC checks the end_of_profile_status flag (eops) and acts as follows:

If eops=2, then the stream is to remain in STREAM_ON state (common use case is a fade-in).

If eops=0 or 1, then the stream needs to be stopped and removed from the final output (e.g. after final fade-out), so transitions to STREAM_DEPOP state.

Figure 15:
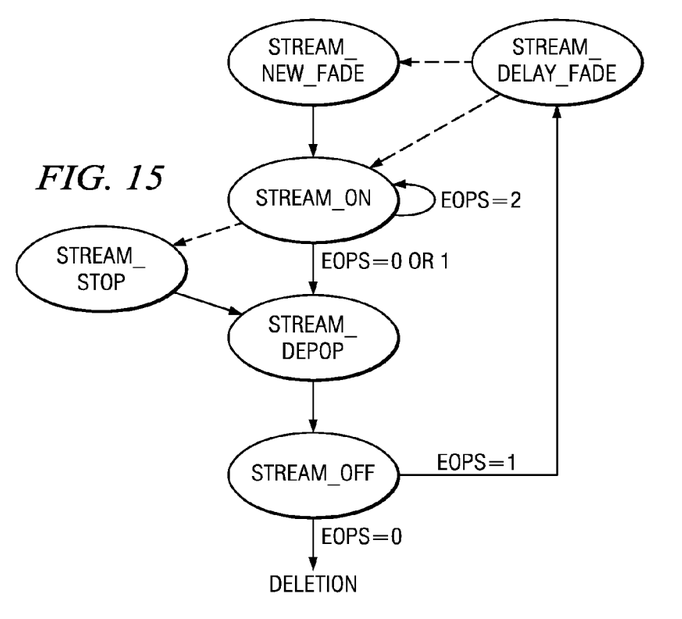
FIG. 15 is a state diagram.

FIG. 15 illustrates the state machine actions; the broken arrows show the user-triggered state changes.

If the user wishes to stop a stream right away, he can change the stream status to STREAM_STOP; see broken arrow in the left center of FIG. 15. This will immediately place the stream in the STREAM_DEPOP state. The STREAM_DEPOP state performs an exponential decay based on the final samples to remove any high popping sounds. Upon completion, the state transitions automatically to STREAM_OFF state. The STREAM_OFF state means that the stream now contributes absolutely nothing to the final output. The value of the end_of_profile_status flag then determines the next state as follows:

If eops=1, then all structures for the stream are retained and set inactive (i.e. transition to STREAM_DELAY_FADE state).

If eops=0, then the stream is deleted from the crossfader instance.

The user can use the end_of_profile_status flag and the stream_state to obtain various behaviors from the XFC. The following table summarizes these controls.

TABLE

| end_of_profile_status | stream_state | Result |
|---|---|---|
| \multicolumn{3}{l}{User-controlled states} | | |
| 0 | STREAM_NEW_FADE | A fade is started, and upon completion the stream is deleted from the XFC (fade-out to off) |
| 1 | STREAM_NEW_FADE | A fade is started, and upon completion, the stream is placed in STREAM_DELAY_FADE state (remains resident, but not mixed in) (fade-out to off) |
| 2 | STREAM_NEW_FADE | A fade is started, and upon completion, the stream is active and mixed in (fade-in to playing) |
| 2 | STREAM_ON | The stream is active and mixed in right away at the volume level set at XFC creation (start playing immediately) |
| 0 | STREAM_DELAY_FADE | A fade is set up, but does not begin until the state is set to STREAM_NEW_FADE. Upon completion of the fade, the stream is deleted from the XFC (fade-out to off) |
| 1 | STREAM_DELAY_FADE | A fade is set up, but does not begin until the state is set to STREAM_NEW_FADE. Upon completion of the fade, the stream is placed in STREAM_DELAY_FADE state (remains resident, but not mixed in). (fade-out to off) |
| 2 | STREAM_DELAY_FADE | A fade is set up, but does not begin until the state is set to STREAM_NEW_FADE. Upon completion of the fade, the stream is active and mixed in (fade-in to playing) |
| 0 | STREAM_STOP | Stream stops playing, and depop removes loud artifacts from this sudden stop. Once depop is finished, the stream is deleted from the XFC. |
| 1 | STREAM_STOP | Stream stops playing, and depop removes loud artifacts from this sudden stop. Once depop is finished, the stream is placed in STREAM_DELAY_FADE (remains resident, but not mixed in). |

11. Fade Timing Examples

The setting of states by the user is a simple process in the application code. The following code examples demonstrate how to perform fade-in's and fade-out's.

A first example shows how to initiate a fade-in at a particular time. Note that the v_init parameter must be set at XFC creation to start the fade correctly.

```
Int16 fadein_del_t[]={345};// duration is 345 updates
//(each update=64 samples/chan)
Int16 fadein_s[]={+18836}; // slope
XFC_user_volume_profile profile1;
profile1.num_events=1; // number of segments in fade
profile1.del_t=fadein_del_t;// time lengths of fade
//segments (units=# updates)
profile1.s=fadein_s; // slopes for each fade segment
profile1.v_init=-10240; // initial volume level
profile1.end_of_profile_status=2; // keep STREAM_ON at
// end of fade
profile1.status=STREAM_DELAY_FADE;
........
if (frame_num==TIME_FADE_IN_1) {// when we reach the time
// to start the fade
XFC_getStatus(XFCHandle, (XFC_Status *)&xfcStatus);
profile1.status=STREAM_NEW_FADE; // start the fade
stream_id=XFC_fade(XFCHandle, xfcStatus, &profile1);
}
```

A second example shows how to initiate a fade-out at a particular time. Upon completion, the stream will remain and be placed in STREAM_DELAY_FADE state.

```
Int16 fadeout_del_t[]={345};// duration is 345 updates
//(each update=64 samples/chan)
Int16 fadeout_s[]={-32720}; // slope
XFC_user_volume_profile profile1;
profile1.num_events=1; // number of segments in fade
profile1.del_t=fadeout_del_t;// time lengths of fade
//segments (units=# updates)
profile1.s=fadeout_s; // slopes for each fade segment
profile1.v_init=-32768; // initial volume level
profile1.end_of_profile_status=1;// signals XFC to keep
//stream at end of fade-out
........
if (frame_num==TIME_FADE_OUT_1) {
XFC_getStatus(XFCHandle, (XFC_Status *)&xfcStatus);
profile1.status=STREAM_NEW_FADE;
stream_id=XFC_fade(XFCHandle, xfcStatus, &profile1);
}
```

A third example shows how to initiate a fade-out at a particular time. Upon completion, the stream will be deleted.

```
Int16 fadeout_del_t[]={345};// duration is 345 updates
//(each update=64 samples/chan)
Int16 fadeout_s[]={-32720}; // slope
XFC_user_volume_profile profile1;
profile1.num_events=1; // number of segments in fade
profile1.del_t=fadeout_del_t;// time lengths of fade
//segments (units=# updates)
profile1.s=fadeout_s; // slopes for each fade segment
profile1.v_init=-32768; // initial volume level
profile1.end_of_profile_status=0;// signals XFC to delete
//stream at end of fade-out
profile1.status=STREAM_DELAY_FADE;
..........
if (frame_num==TIME_FADE_OUT_1) {
 XFC_getStatus(XFCHandle, (XFC_Status *)&xfcStatus);
 profile1.status=STREAM_NEW_FADE;
 stream_id=XFC_fade(XFCHandle, xfcStatus, &profile1);
}
```

12. De-Pop Processing

Figure 16:
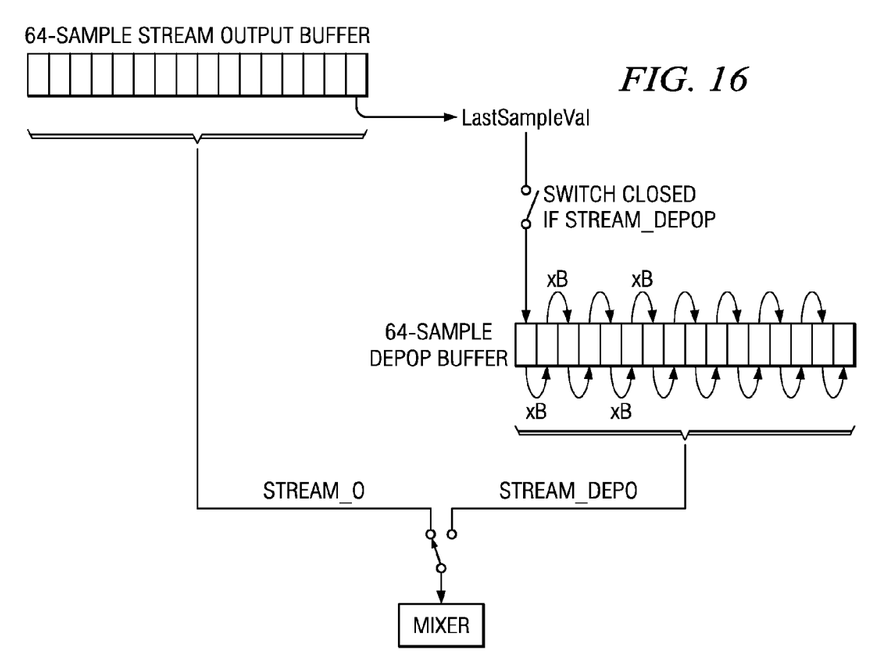
FIG. 16 shows de-pop.

De-pop processing is used to smooth sudden stops in an audio stream;

FIG. 16 displays this processing. When in STREAM_ON state, output buffer is simply fed to the mixer, and the last value of each buffer is saved to LastSampleVal [j]. When a transition occurs to STREAM_DEPOP state, the first value in the depop buffer is filled with LastSampleVal [j], and each subsequent value in the Depop_buffer is slightly less than the previous value (i.e., depop_buf [i+1]=depop_buf [i]*B, where B is just below 1). Depop_buffer is continually fed into the mixer until the absolute value of the overall PCM value is less than a threshold (i.e., <+50). Once below threshold, this stream is removed from the mixer completely.

Figure 17:
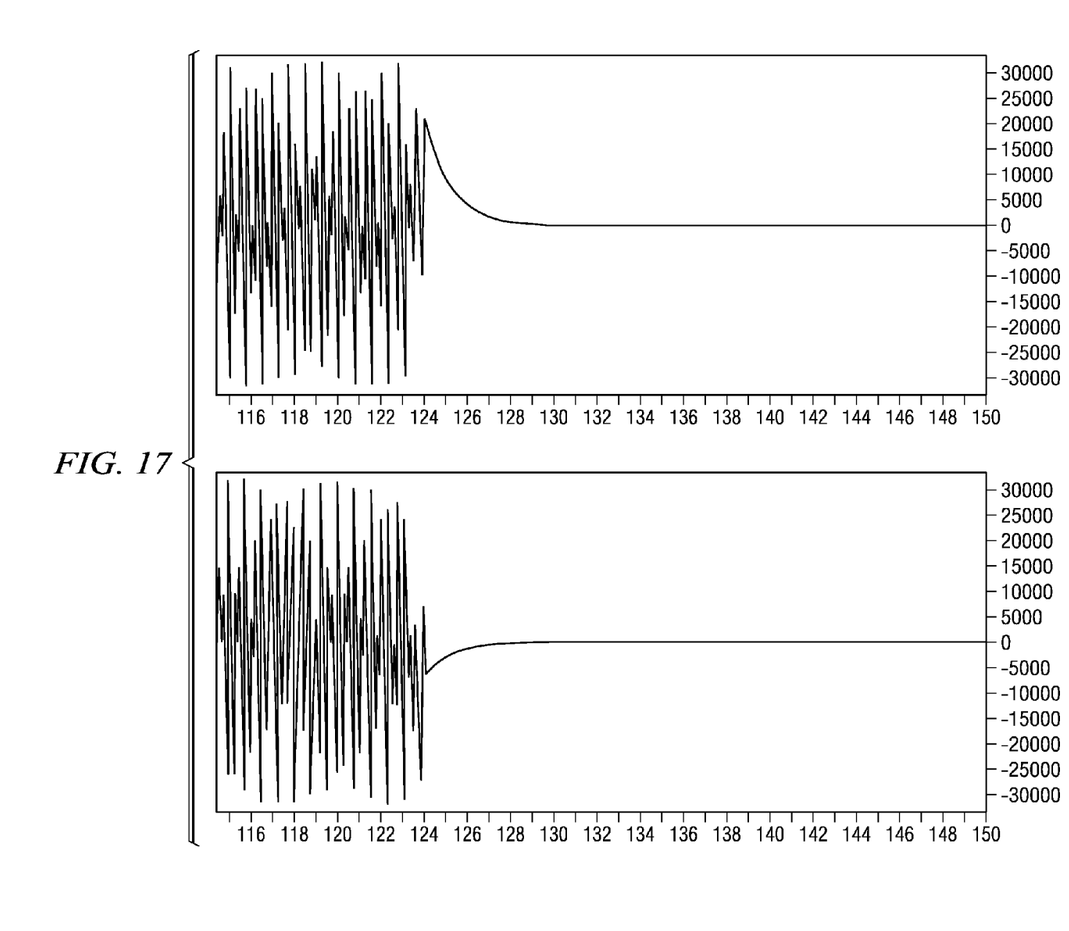
FIGS. 17-18 are examples.

FIG. 17 illustrates the de-pop processing for a stereo stream (top and bottom panels in FIG. 17 are the left and right channels). At the left of FIG. 17 the Stereo stream is playing (STREAM_ON state). User places stream in STREAM_STOP state, which immediately alters the state to STREAM_DEPOP. While in STREAM_DEPOP state, the PCM levels of both channels are reduced exponentially toward zero (center-left of both panels in FIG. 17). When both channels are below a threshold, the stream is turned off (STREAM_OFF). Based on the end_of_profile_status flag, the stream is then either placed inactive (STREAM_DELAY_FADE) or deleted; see FIG. 15.

13. Application Example

This section describes a sample application to elucidate the needed code when using the XFC module. Prior section 8 summarizes the basic controls to attain specific behaviors from the XFC.

(1) Declare the needed XFC handle and parameter structure. Set up the PCM buffers.

```
XFC_Handle XFCHandle;
XFC_Params XFCParams;
XFC_Status xfcStatus;
const PCM_Descriptor outputInfo={2, 0, 16, 64, 44100};
const PCM_Descriptor inputInfo[3]={
 {2, 0, 16, 64, 44100},
 {2, 0, 16, 64, 44100},
 {2, 0, 16, 64, 44100}
};
PCM_Buffer *buffers[]={(PCM_Buffer) OutBuf,
(PCM_Buffer) InBuf1, (PCM_Buffer) InBuf2,
(PCM_Buffer) InBuf3};
```

(2) Create the User Volume Profiles for desired fades. A fade can be a simple fade-in or fade-out, or it can be a more complicated multi-segment volume profile. Each fade needs two arrays: del_t [ ] and s [ ]. The del_t [ ] array specifies the amount of time (in number of 64-sample updates) until the next slope-change event. The s [ ] array specifies the slope for each individual del_t [ ] element. Thus, the del_t [ ] and s [ ] arrays must have the exact same length. The slope is expressed in dB/update with the value being a Q17 representation. (Note: no segment can be less than 4 updates in length.)

```
Int16 fadein_del_t[ ]={344, 345, 4};
Int16 fadein_s[ ]={-18836, +18836, 0};
Int16 fadeout_del_t[ ]={345, 4};
Int16 fadeout_s[ ]={-32720, 0};
```

In the example code found above, the fade-in volume profile will hold a slope of $-18836$ ($-18836/2^{17}=-0.143$ dB/update) for 344 updates (about 0.5 seconds at 44.1 kHz), then hold a slope of $+18836$ ($18836/2^{17}=+99$ dB/sec) for 345 updates, followed by a 4-update segment with a flat slope. The fade-out volume profile will have a slope of $-32720$ for 345 updates, followed by a flat slope for 4 64-sample updates.

In addition to the slopes and times, the structure XFC_user_volume_profile also has other fields which determine the XFC behavior:

(i) num_events—number of volume fade segments (ii) end_of_profile_status—stream status when the volume profile finishes     0—delete stream upon completion     1—stream resident and silent upon completion     2—stream active and playing upon completion (iii) status—the current state of the stream. User should only set to one of four possible values:

STREAM_ON—starts stream immediately without any fade

STREAM_NEW_FADE—start new fade immediately after the XFC_fade() call     STREAM_DELAY_FADE—stream is resident, but no fade is performed and stream is not mixed into final output     STREAM_STOP—stream stops playing, and depop removes loud artifacts caused by this sudden stop

```
XFC_user_volume_profile profile1;
profile1.num_events=3;
profile1.del_t=fadein_del_t;
profile1.s=fadein_s;
profile1.end_of_profile_status=2;
profile1.status=STREAM_DELAY_FADE;
```

(3) Create the XFC coefficients, which govern how the streams can affect one another. If the number of streams and their relationships are known at creation, these can be put in the XFC parameters and left unchanged throughout execution. If the numbers of streams or relationships between streams change after creation, the coefficients need to be altered accordingly.

The following coefficients describe a common scenario where Streams 1 and 2 are of equal priority, and Stream 3 has higher priority than the other two streams.

```
#define TEST_NUM_COLS 3
#define TEST_ALPHA_NUM_ROWS 1
#define TEST_BETA_NUM_ROWS 2
#define TEST_GAMMA_NUM_ROWS 1
Int16 test_alphaar_1 []={0, 0, 0}; // unequal priority multipliers
Int16 *test_alpha_1 []={test_alphaar_1}; // pointer to alphas
Int16 beta_0 []={4096, 4096}; // equal priority mult., constants
```

```
Int16 test_betaar_1 []={
  {0, 4096, 0},
  {4096, 0, 0}
}; // equal priority mult., vars
Int16 *test_beta_1 []={test_betaar_1}; // pointer to betas
Int16 gamma_0 []={4096}; // equal priority mult., constants
Int16 test_gammaar_1[]=(0, 0, -4096); // equal priority
mult., vars
Int16 *test_gamma_1[]={test_gammaar_1}; // pointer to
gammas
Uint32 alpha_bm[]={1}; //bitmap for applying alpha terms
Uint32 beta_bm[]={1, 2}; //bitmap for applying beta terms
Uint32 gamma_bm[]={3}; //bitmap for applying gamma
terms
```
(4) Set up XFCParams in preparation for XFC creation.
XFCParams.numStreams=3;
XFCParams.out=outputInfo;
XFCParams.inputInfo=inputInfo;
XFCParams.profiles[0]=profile1;
XFCParams.profiles[1]=profile1;
XFCParams.profiles[2]=profile1;
XFCParams.model_coefficients.num_cols=TEST_NUM_
COLS;
XFCParams.model_coefficients.alpha_rows=
   TEST_ALPHA_NUM_ROWS;
XFCParams.model_coefficients.beta_rows=
   TEST_BETA_NUM_ROWS;
XFCParams.model_coefficients.gamma_rows=
   TEST_GAMMA_NUM_ROWS;
XFCParams.model_coefficients.alpha_1=(Int16**)
&test_alpha_1;
XFCParams.model_coefficients.beta_0=beta_0;
XFCParams.modelcoefficients.beta_1=(Int16**)
&test_beta_1;
XFCParams.model_coefficients.gamma_0=gamma_0;
XFCParams.model_coefficients.gamma_1=
   (Int16**)&test_gamma_1;
XFCParams.model_coefficients.alpha_bm=alpha_bm;
   XFCParams.model_coefficients.beta_bm=beta_bm;
   XFCParams.model_coefficients.gamma_bm=gamma_bm;
(5) Create an instance of the XFC object. A single instantiation can be used on stereo or mono streams. After creation, use XFC_getStatus to obtain the active stream ID's from the XFC module.
XFCHandle=XFC_create((const IXCF_Fxns *)&XFC_TI_IXFC, &XFCParams);
if (XFCHandle==NULL)
return (0);
XFC_getStatus(XFCHandle, &xfcStatus);
active_stream_ids[0]=xfcStatus.stream_id_list[0];
active_stream_ids[1]=xfcStatus.stream_id_list[1];
active_stream_ids[2]=xfcStatus.stream_id_list[2];
(6) Call XFC_fade to begin a fade, which starts at the next XFC_apply call.
if (frame_num==TIME_FADE_IN_1) {
XFC_getStatus(XFCHandle, (XFC_Status *)&xfcStatus);
profile1.status=STREAM_NEW_FADE;
stream_id=XFC_fade(XFCHandle, xfcStatus, &profile1);
}
(7) The XFC is continually (periodically) applied to the input stream(s) (based on the XFC coefficients that have already been set). This call to XFC_apply does not depend on the existence of a fade, because it is always using the MIX module to fill the output buffer. Each time the apply function has filled the 64-sample output buffer, it returns to the application.
activeStreams=XFC_apply(XFCHandle, buffers);
The application continually loops through the XFC_apply calls, and we occasionally call the conditional XFC_fade function when a new user volume profile begins.
(8) When all streams are completed, delete the current instance of the XFC object. This will also delete the associated MIX and VOL objects for all the active streams. (Note that the algorithm can delete VOL objects as streams end individually. This is accomplished by setting the end_of_profile_status flag to 0 for its final fade-out.)
XFC delete (XFCHandle);

14. Three Input Streams Example Graphs

Figure 18:
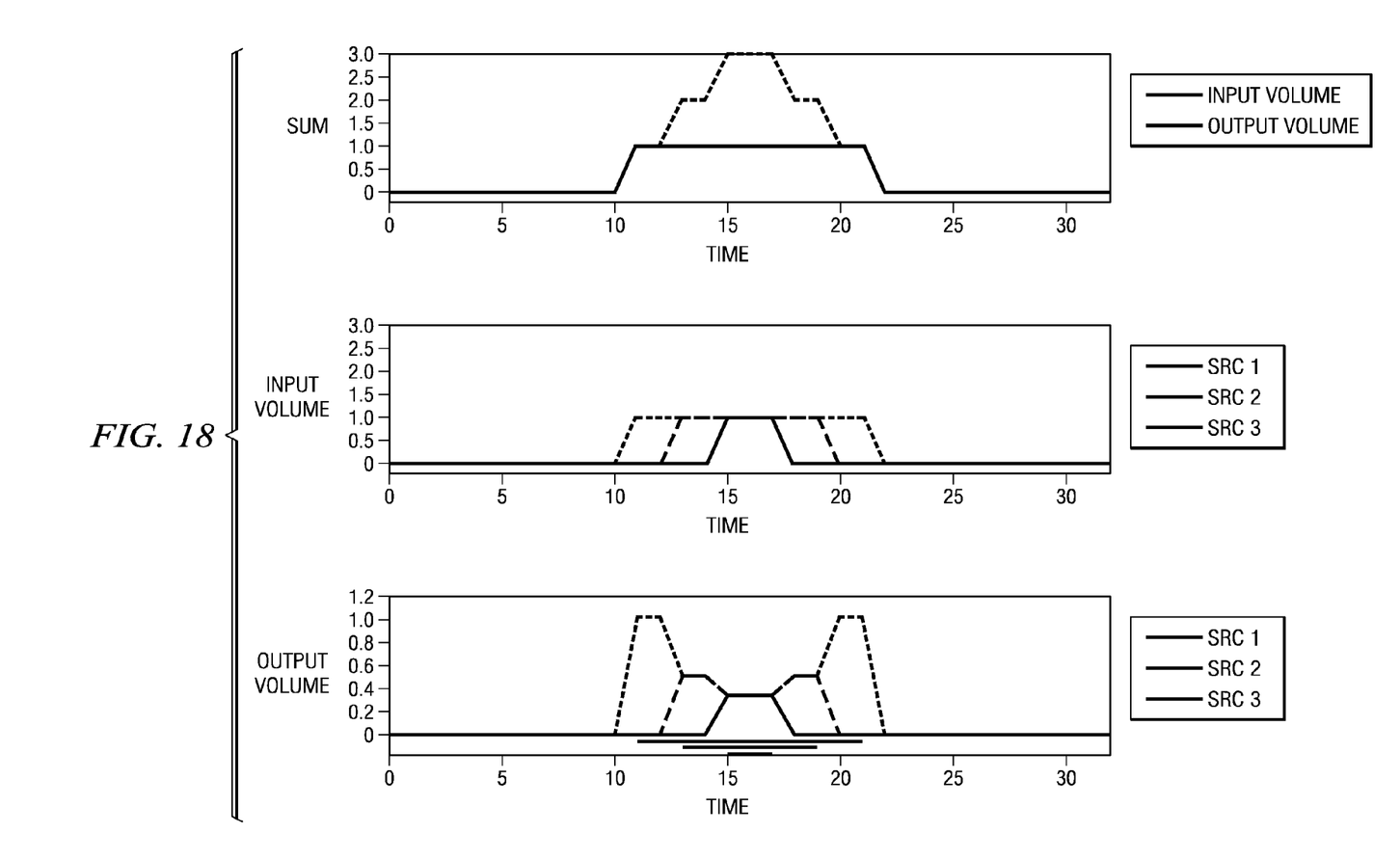

FIGS. 5, 12, and 18 illustrate three examples of the operation of the module for three input streams.

For FIG. 5 three streams enter and exit at different times. Model coefficients are set up so that all three streams affect one another equally to avoid saturation. These coefficients define the equations that determine how the XFC alters volume targets:

$$v'1=[1/(1+v2+v3)]*v1$$

$$v'2=[1/(1+v1+v3)]*v2$$

$$v'3=[1/(1+v1+v2)]*v3$$

v1, v2, and v3 are the volume targets specified through the user volume profiles, while v'1, v'2, v'3 are the final volume targets after the coefficients are applied. Initially, SRC1 is playing when SRC2 enters at the 12-second mark. Volume targets for both SRC1 and SRC2 are altered from 1.0 to 0.5, as determined by the model coefficients (v'1=v'2=1/(1+1+0)*1=0.5). When SRC3 starts its fade-in, the volume targets are again altered automatically (v'1=v'2=v'3=1/(1+1+1)*1=0.33). When SRC3 starts its fade-out, the volume targets for the other two streams are adjusted back to 0.5 by the equations, since the target volume v3=0. When SRC2 begins its ade-out, the adjusted volume target v'1 is set back to 1.0 (v'1=1/(1+0+0)*v1=1.0). Once the coefficients are set up, the XFC performs all adjustments automatically.

FIG. 12 shows crossfade of two streams with interruption by a third one. Model coefficients are set up so that SRC1 is a higher priority than SRC2 and SRC3. SRC2 and SRC3 have equal priority. These coefficients define the equations that determine how the XFC alters volume targets $$v'1=v1$$

$$v'2=[(1-v1)/(1+v3)]*v2$$

$$v'3=[(1-v1)/(1+v2)]*v3$$

Crossfade between SRC2 and SRC3 begins at the 10-second mark. Volume targets in the user volume profiles send the volume of SRC2 to 0 and SRC3 to 1 at the 30-second mark (i.e. 20-second crossfade). The crossfade is interrupted at the 16-second mark by a higher-priority stream (SRC1). This causes SRC2 and SRC3 to reduce their volume further. The crossfade then continues, but the volume targets are now 0 and 0.5, instead of 0 and 1.0, because SRC1 reduces the available dynamic range for the two-stream crossfade. SRC1 is unaffected by the other streams. When SRC1 fades out, the other two streams ramp back to their original crossfade trajectory, since v'3=(1-0)/(1+0)*1=1 and v'2=(1-0)/(1+1)*0=0. Then, SRC2 and SRC3 complete their crossfade by the 30-second mark. When fades are interrupted by the starts of other streams, the XFC module still remembers the original volume targets.

For FIG. 18 a quick fade-in begins after a fade-out has already started. Model coefficients are set up so that the two streams are of equal priority. Equations for alterations of volume targets:

$$v'1 = [1/(1+v2)]*v1$$

$$v'2 = [1/(1+v1)]*v2$$

SRC2 begins its fade-out at the 10-second mark, but is interrupted by a quick SRC1 fade-in. Volume targets of both SRC1 and SRC2 are altered. If the coefficients were not set up to do this, saturation could occur because of the quick fade-in (i.e. sum of input streams >1.0). SRC1 then gradually ramps up to unity (1.0) until SRC2 has reached zero. Because the cross-fade module is event-based, asynchronous fades are easily handled as two separate events.

What is claimed is:

1. A method of a processor for multiple audio stream level control with a single interface, comprising the steps of:
    (a) for each of a plurality of audio streams, providing a multi-segment fade volume profile and a state variable, wherein each stream has an independent state variable;
    (b) providing model coefficients, via said processor, for volume target priority interactions of said streams to automatically avoid saturation, wherein said saturation is automatically avoided setting a relationship between streams of model coefficients and wherein said relationship changes in real-time and creates a dependency between streams; and
    (c) periodically computing volume adjustment factors for said streams using said fade profiles, said state variables, and said model coefficients;
    (d) whereby each of said streams with a state variable indicating an active stream may be mixed into an output without saturation for constantly changing the fade volume according to at least one of the provided fade volume profile and the provided state variable, wherein the shape of the fade and the target volume are constantly changing to avoid saturation.

2. The method of claim 1, wherein said state variables have values including:
    (i) stream_on;
    (ii) stream_new_fade; and
    (iii) stream_delay_fade;
with stream_on indicating a stream is active, stream_new_fade indicating a stream is to begin a fade, and stream_delay_fade indicating a stream is inactive.

3. The method of claim 2 wherein when one of said state variables is set to said stream_new_fade value and said computing of step (c) of claim 1 includes a change of said value from stream_new_fade to stream_on.

4. The method of claim 1 wherein each of said fade volume profiles includes an end_of_profile_status which indicates after completion of a fade of a stream one of (i) deletion of the stream, (ii) stream_delay_fade state for the stream, or (iii) the stream is active.

5. The method of claim 1 wherein said fade volume profiles are piecewise linear.

6. The method of claim 1, further comprising the steps of:
    (a) when a first of said state variables indicates termination of a first of said streams, extending said first stream beyond said termination by replicating and scaling a sample of said first stream prior to termination;
    (b) whereby stream termination artifacts are avoided.

* * * * *